United States Patent
Patel

(10) Patent No.: US 11,153,988 B1
(45) Date of Patent: Oct. 19, 2021

(54) DYNAMIC AISLES FOR COMPUTING DEVICES

(71) Applicant: Core Scientific, Inc., Bellevue, WA (US)

(72) Inventor: Harsh Patel, Stone Mountain, GA (US)

(73) Assignee: Core Scientific, Inc., Bellevue, WA (US)

( * ) Notice: Subject to any disclaimer, the term of this patent is extended or adjusted under 35 U.S.C. 154(b) by 0 days.

(21) Appl. No.: 17/150,340

(22) Filed: Jan. 15, 2021

Related U.S. Application Data

(63) Continuation of application No. 17/095,329, filed on Nov. 11, 2020, now Pat. No. 10,959,349.

(60) Provisional application No. 63/108,652, filed on Nov. 2, 2020.

(51) Int. Cl.
  *H05K 7/20* (2006.01)

(52) U.S. Cl.
  CPC ..... *H05K 7/20209* (2013.01); *H05K 7/20145* (2013.01); *H05K 7/20745* (2013.01); *H05K 7/20836* (2013.01)

(58) Field of Classification Search
  CPC ........... H05K 7/20209; H05K 7/20145; H05K 7/20745; H05K 7/20836; H05K 7/1497; H05K 7/2079; H05K 7/20136; H05K 7/20827; F24F 2007/004; F24F 11/0001; F24F 7/00; G06F 1/20; G06F 1/206
  USPC ......... 361/695, 694, 679.48, 679.49, 679.51, 361/690, 752; 165/104.33; 454/184
  See application file for complete search history.

(56) References Cited

U.S. PATENT DOCUMENTS

| | | |
|---|---|---|
| 3,363,534 A | 1/1968 | Spradling |
| 3,614,922 A | 10/1971 | Sobin |
| 4,872,504 A | 10/1989 | Huebner |
| 6,135,875 A | 10/2000 | French |
| 6,483,699 B1 | 11/2002 | Salmonson et al. |
| 8,223,495 B1 | 7/2012 | Carlson et al. |
| 8,659,895 B1 | 2/2014 | Carlson et al. |
| 8,857,204 B2 | 10/2014 | Reytblat |
| 8,943,757 B2 | 2/2015 | Parizeau et al. |

(Continued)

FOREIGN PATENT DOCUMENTS

| | | |
|---|---|---|
| WO | 02104090 A1 | 12/2002 |
| WO | 2013039645 | 3/2013 |

OTHER PUBLICATIONS

Cindy Kiddy: "psd1212ptb1 SUNON", Taiwan (ROC), Dec. 31, 2010, pp. 1-14, XP055657800, retrieved Jan. 14, 2020.

(Continued)

*Primary Examiner* — Mandeep S Buttar
(74) *Attorney, Agent, or Firm* — Fishman Stewart PLLC

(57) ABSTRACT

Systems and methods for managing airflow for cooling computing devices (e.g. in a data center) in normal and cold environments are disclosed. In one embodiment, the method comprises positioning the computing devices on a plurality of racks with air barriers to create hot and cold aisles. The computing devices may be configured in a first mode to draw in cool air the cold aisles and exhaust heated air into the hot aisles. Temperatures in the cold aisles may be periodically measured. In response to temperatures below a predetermined threshold, one or more of the cold aisles may be converted into a temporary hot aisle by adjusting ventilation openings and configuring a subset of the computing devices to temporarily draw in warm air from the temporary hot aisle.

16 Claims, 6 Drawing Sheets

(56) References Cited

U.S. PATENT DOCUMENTS

| | | | |
|---|---|---|---|
| 9,313,929 B1 | 4/2016 | Malone et al. | |
| 9,476,657 B1 | 10/2016 | Pettis et al. | |
| 9,554,491 B1 | 1/2017 | Wong et al. | |
| 9,629,285 B1 | 4/2017 | Lachapelle et al. | |
| 9,674,988 B2 | 6/2017 | Dernis et al. | |
| 9,677,777 B2 | 6/2017 | Karamanos et al. | |
| 2008/0055848 A1 | 3/2008 | Hamburgen et al. | |
| 2009/0310300 A1 | 12/2009 | Chrysler | |
| 2010/0188810 A1 | 7/2010 | Andersen et al. | |
| 2011/0138708 A1 | 6/2011 | Chazelle et al. | |
| 2012/0024502 A1 | 2/2012 | Khalifa et al. | |
| 2012/0142265 A1 | 6/2012 | Wei | |
| 2012/0197828 A1 | 8/2012 | Yi | |
| 2012/0258654 A1 | 10/2012 | Peng et al. | |
| 2013/0062047 A1 | 3/2013 | Vaney et al. | |
| 2013/0244563 A1* | 9/2013 | Noteboom | H05K 7/20309 454/250 |
| 2014/0069127 A1 | 3/2014 | Bailey et al. | |
| 2014/0133092 A1 | 5/2014 | Leckelt et al. | |
| 2015/0099449 A1* | 4/2015 | Chen | H05K 7/20736 454/184 |
| 2015/0241888 A1 | 8/2015 | Kodama | |
| 2015/0327408 A1 | 11/2015 | Ruiz et al. | |
| 2016/0021782 A1 | 1/2016 | Kurosaki et al. | |
| 2016/0128226 A1* | 5/2016 | Stellick | H05K 7/20727 361/679.46 |
| 2016/0192542 A1 | 6/2016 | LeFebvre et al. | |
| 2016/0249484 A1 | 8/2016 | Parizeau et al. | |
| 2017/0042067 A1 | 2/2017 | Parizeau et al. | |
| 2017/0176029 A1 | 6/2017 | Wilding et al. | |
| 2017/0196125 A1 | 7/2017 | Crosby, Jr. et al. | |
| 2017/0269648 A1 | 9/2017 | Ruiz et al. | |
| 2018/0077822 A1 | 3/2018 | Sloan et al. | |

OTHER PUBLICATIONS

ISR dated Jan. 23, 2020 for Int'l Appl PCT/US2019/044673.
PCT Partial ISR dated Nov. 11, 2019 for Int'l Appl PCT/US2019/044673.

* cited by examiner

DYNAMIC AISLES FOR COMPUTING DEVICES

CROSS-REFERENCE TO RELATED APPLICATIONS

This application is a continuation of U.S. Provisional patent application Ser. No. 17/095,329, filed Nov. 11, 2020, titled DYNAMIC AISLES FOR COMPUTING DEVICES, the contents of which are hereby incorporated by reference in their entirety.

This application claims the benefit of U.S. Provisional Patent Application Ser. No. 63/108,652, filed on Nov. 2, 2020, titled "DYNAMIC AISLES FOR COMPUTING DEVICES", the contents of which are hereby incorporated by reference in their entirety.

TECHNICAL FIELD

The present disclosure generally relates to the field of computing and, more particularly, to systems and methods for managing airflow for groups of computing devices, such as in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute intensive workloads (e.g., rendering, AI, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Traditional methods for improving cooling of computing devices in data centers include mixing in refrigerated air to reduce the temperature of the air that is forced across the computing device by its built-in cooling fans. A significant drawback to this approach is that refrigeration uses significant amounts of energy on top of the energy already used by the computing devices themselves.

For these reasons, new data center architectures have been designed to dramatically improve airflow so that ambient air can be used for cooling most if not all of the year based on the location of the data center. One drawback to these improved airflow designs occurs during winter when the ambient air temperature drops so low that the computing devices begin to perform poorly. Some data centers may use heat pumps or furnaces to preheat the air incoming to the data center or mixing chambers with recirculating ductwork and valves that mix of the exhaust heat from the computing devices with the incoming air to raise the temperature. However, heating the air with heat pumps or furnaces is not energy efficient, and using mixing chambers with recirculating ductwork can negatively impact airflow.

For at least these reasons, there is a desire for a solution that efficiently cools computing devices and efficiently maintains temperatures above undesirable levels when ambient temperatures are low.

SUMMARY

A system and method for managing airflow for a plurality of computing devices (e.g., in a data center) are contemplated. In one embodiment, the method comprises positioning the computing devices on a plurality of racks. Each of the computing devices has at least one cooling fan configured to generate an airflow through the computing device. The computing devices may be configured in a first mode to draw in cool air from one or more cold aisles adjacent to the racks and exhaust heated air into one or more hot aisles. The computing devices may be connected via a network, and computing workloads may be distributed to the computing devices via the network. Work may be performed on the computing workloads by the computing devices. Temperatures in at least the cold aisles may be periodically measured. In response to measured temperatures being below a predetermined threshold for a predetermined time period, at least one of the cold aisles may be changed into a temporary hot aisle by (i) adjusting one or more ventilation openings, and (ii) configuring at least a subset of the computing devices in a second mode to draw in warm air from the temporary hot aisle.

In some embodiments, the cooling fans may be configured to rotate in a first direction when the computing devices are in the first mode and a second direction in the second mode. The computing devices' modes may be dynamically switched based on the periodically measured cold aisle temperatures. The racks may be oriented in parallel to form alternating cold-hot aisles when the computing devices are configured in the first mode and alternating cold-hot-hot aisles or cold-hot-hot-hot aisles when configured in the second mode. In each of the modes, the cooling fans' speed may be dynamically adjusted on the subset of the plurality of computing devices based on the measured temperature.

In some embodiments, the computing devices' modes may be switched by changing the rotation of the devices' cooling fans. In other embodiments, the computing devices' modes may be switched by changing the orientation of the cooling fans (e.g. by rotating the computing devices).

In some embodiments, the method may further comprise reading a weather forecast, and in response to the weather forecast predicating ambient temperatures greater a predetermined threshold for a predetermined amount of time, changing the mode of one a subset of the computing devices.

In some embodiments, a speed value may be set for each of the computing devices' cooling fans according to a pattern which may for example vary based on the position of each of the computing devices on the racks.

In some embodiments, in response to the measured temperature being above the predetermined threshold for a predetermined amount of time, the temporary hot aisle may be reverted back its normal cold aisle role by (a) configuring the subset of the plurality of computing devices back to the first mode, (b) adjusting one or more ventilation openings, and (c) configuring a subset of the plurality of computing devices to draw in warmed air from the temporary hot aisle.

A system for managing computing devices is also contemplated. In one embodiment, the system may comprise a set of racks configured to hold the computing devices (which each have at least one associated cooling fan) and an air barrier. The air barrier may be connected to the racks and may form cold aisles and hot aisles. The air barrier may have openings configured to permit air to be drawn through the computing devices by the cooling fans from the cold aisles and exhausted into the hot aisles. The system may further comprise a set of adjustable cool air vents and temperature sensors configured to periodically measure temperatures in the hot aisles and cold aisles. The system may also comprise a controller configured to respond to the measured temperatures being below a predetermined threshold by changing at least one of the cold aisles into a temporary hot aisle. This may be performed by (i) adjusting or closing one or more of the cool air vents, and (ii) configuring at least a subset of the computing devices in a second mode to draw in warm air from the temporary hot aisle.

In some embodiments, the controller may be further configured to adjust the cool air vents based on the measured temperatures in the temporary hot aisle to keep the temperature of the temporary hot aisle within a predetermined desirable range.

In some embodiments, the controller may be configured to form alternating cold-hot aisles when the measured temperature is above the predetermined threshold for a predetermined period of time and alternating cold-hot-hot aisles or cold-hot-hot-hot aisles when the measured temperature is below the predetermined threshold for the predetermined period of time.

In some embodiments, the controller may also be configured to read weather forecast data and form alternating cold-hot aisles when the temperature and or weather forecast data indicate the cold aisle temperatures are predicted to be above the predetermined threshold for a predetermined period of time and alternating cold-hot-hot or cold-hot-hot-hot aisles when the temperature and or weather forecast data indicate the cold aisle temperatures are predicted to be below the predetermined threshold for a predetermined period of time.

A computer executable program for managing cooling of computing devices is also contemplated. The program may be stored on a non-transitory, computer-readable storage medium and comprise instructions executable by a processor of a computational device to configure a set of computing devices in a first mode to draw in cool air from one or more cold aisles and to exhaust heated air into one or more hot aisles. The instructions may also distribute computing workloads to the computing devices and gather temperature data (e.g., from the cold aisles or from the hot and cold aisles). In response to the gathered temperature data being below a predetermined threshold for a predetermined time period, one or more of the cold aisles may be temporarily changed into a temporary hot aisle by (i) adjusting one or more ventilation openings, and (ii) configuring a subset of the computing devices in a second mode to draw in warm air from the temporary hot aisle.

The gathered temperature data may be cold aisle temperatures read from network-enabled temperature sensors and or weather forecast data read from a weather web service. In some embodiments, the aisle configuration may be selected dynamically (e.g., based on the gathered temperature data) from a set of configurations including alternating cold-hot aisles, alternative cold-hot-hot aisles, and alternating cold-hot-hot-hot aisles.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
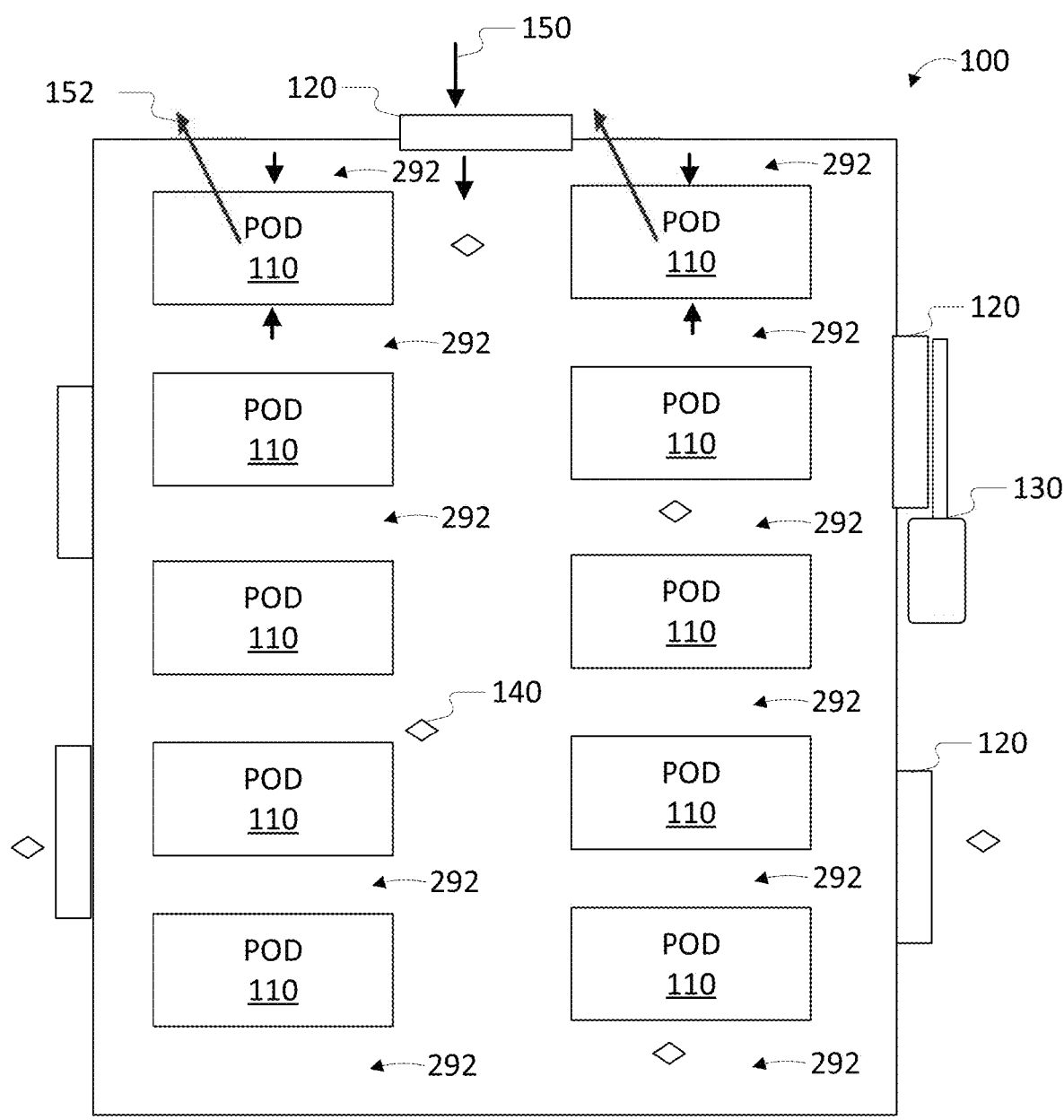
FIG. 1 is a top-down view of one example embodiment of a data center for computing devices.

Referring now to FIG. 1, a top-down view of one example of a data center 100 for computing devices is shown. The data center 100 is configured with a large number of pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned above the center of each pod) to capture the hot waste air and then discharge it out of the data center via vents in the roof of the data center.

Cool air is drawn into the data center 100 through vents (e.g., vent 120) indicated by arrow 150. The vents may be adjustable (e.g. via dampers or louvers) so that airflow can be controlled (e.g., restricted or blocked) as needed. Once the air is inside data center 100, it is drawn through cold aisles 292 into the sides of pods 110 as indicated and then expelled out of the data center via an exhaust opening (e.g., out the top and middle of pod 110 as indicated by arrow 152). One or more environmental sensors 140 may be located inside and or outside the data center. These sensors may be network-enabled (e.g., wireless) and provide various environmental data such as temperature, humidity, barometric pressure, wind speed, wind direction, and solar radiation levels (e.g., cloudiness). A subset of these sensors may be located inside the data center, for example, in the cold aisles where cold air is drawn into the pods 110. Another subset of the sensors may be located outside the data center 100, e.g., on different sides of the data center near different air intake vents. This enables the sensors to record environmental data that may vary on the different sides of the data center. For example, at certain times of the day temperatures on one side of the data center may be higher than temperatures on another side of the data center. This may be due to the angle of the sun striking that area outside the data center, or due to shade from nearby trees or structures. In these cases, it may be beneficial to open the vents on the cooler side of the data center and close the vents on the hotter side of the data center.

Some of the external air vents may have an associated cooling unit 130 that may be turned on as needed to reduce the temperature of the incoming outside air. For example, these may include refrigerated air units or misters or humidifiers that can be turned on during particularly hot days when the outside air is too warm to effectively cool the computing devices in pods 110.

In some embodiments, the volume of air inside data center 100 may be significant (much larger than shown in the figure). In these embodiments, there may be a significant delay in the change in air temperature of the air entering a pod relative to a change in the air temperature entering a vent 120. Depending on the configuration of the data center 100, significant mixing of the internal and external air may occur before being drawn into pod 110. Some data centers may be configured with baffles or adjustable vents and fans to encourage this mixing. By placing a number of environmental sensors 140 in different locations in data center 100, this mixing and progression of air temperatures maybe tracked over time.

Figure 2:
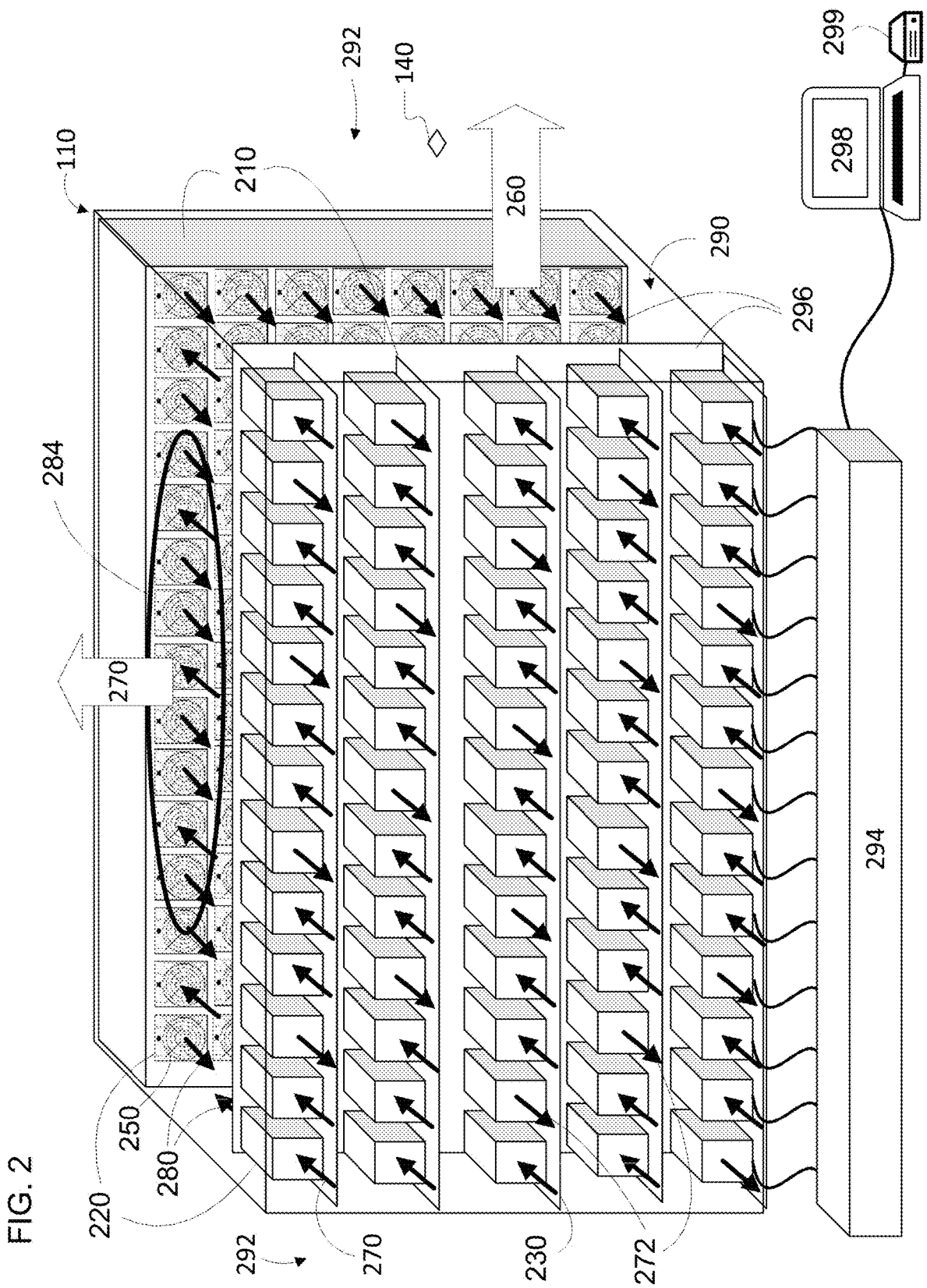
FIG. 2 is a perspective view of one example embodiment of a pod housing computing devices in a data center according to the teachings of the present disclosure.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of shelves 230. Each computing device 220 has one or more cooling fans 250 configured to generate airflow through the computing device for cooling by drawing in air from outside the pod as shown by arrow 270. The moving air draws heat from computing device 220 and is exhausted from the computing devices as shown by arrows 280.

In some embodiments, computing device 220 may have two fans, one on the intake side and one on the exhaust side. In other embodiments multiple smaller fans may be used within computing device 220. Heated air is exhausted by computing devices 220 into the space between racks 210 called a hot aisle 290. The hot aisle 290 is typically sealed except for one or more exhaust openings 284 through which the heated air exits. In some embodiments, these openings may be on the side (e.g. ends) of the pod 110. In other embodiments as shown, the exhaust openings 284 may be located at the top of hot aisle 290 with the heated air exiting above the pod as indicated by arrow 270. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents. In some embodiments, the computing devices 220 may be sealed to the air barrier 296 (e.g., with gaskets), but complete sealing is not required, and some minor leakage of hot air from the hot aisles to cold aisles and vice versa may occur (e.g., around access doors to the hot aisle, around vent seals, and around the edges of the computing devices 220 and the air barrier 296 by the exhaust openings 284) without substantially negatively impacting performance.

Computing devices 220 are networked together with network switch 294 and may be organized by mapping physical computing device positions within the pod, rack and shelf by the network ports on switch 294. This network connection allows management instructions and computing jobs to be sent (e.g., from controller 298) to each computing device 220, and data such as device status information (e.g., temperature information) and results of the computing jobs to be returned. Example computing jobs, also called workloads, include solving blocks or calculating hashes for blockchain networks, performing scientific simulations, image processing for artificial intelligence and machine learning, and graphics rendering. Switch 294 may also be connected to other networks such as the internet, as well as a controller 298 that is configured to execute a management application (e.g. stored on computer readable media 299) to manage computing devices 220. Controller 298 may be a traditional PC or server, or specialized appliance. Controller 298 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust. The program code may execute entirely on the controller 298 as a stand-alone software package, partly on the management computer/controller 298 and partly on a remote computer or computing devices 220, or entirely on a remote computer or computing devices 220.

In order to better cool computing devices 220, the management application may be configured to dispatch instructions to computing devices 220 setting their fan speeds according to one or more predetermined patterns as described in greater detail below. While different computing devices will have different interfaces for setting fan speed, one example is that the computing device will have a network port open that will accept management commands such as setting the fan speed, voltage level, operating frequency, etc. The management application may provide a user interface for simplified management. For example, the management application may be configured to create a model of the data center based on device to port mappings and permit the user to specify a maximum setting (e.g., maximum fan setting), a minimum setting (e.g., minimum fan settings), and a type of pattern (e.g., linear gradient or cubic). With this information the management application may then automatically calculate the values (e.g., fan speed settings) for each computing device based on the distribution of the computing devices on the rack. The management application may also prompt the user to specify timing and the direction for any desired shifts or rotations of the patterns.

While the illustrated examples show the computing devices 220 arranged in two-dimensional arrays that are planar and perpendicular to the floor, other arrangements are possible and contemplated. For example, the two-dimensional array may be sloped or angled relative to the floor (e.g., with each shelf angled and or offset from the one below it) and or non-planar (e.g., with each shelf angled and or offset from the one next to it).

In some embodiments, controller 298 may be connected (e.g., wirelessly) to one or more environmental sensors 140. Controller 298 may be configured to periodically read temperature data for cold aisle 292 and or ambient temperatures external to the data center. Controller 298 may also be configured to Access weather forecast data (e.g., from an Internet-based weather web service). In response to the measured temperature or the predicted temperature according to the weather forecast, being below a predetermined threshold, the controller 298 may be configured to reverse the airflow in one or more of computing devices 220. This allows mixing of the hot air from the hot aisle with the cool ambient air from the cold aisle 292 bring up the cool temperature to a more acceptable range. For example, some computing devices have a recommended operating temperature range or optimal operating temperature range for performance of 0° C.-40° C., So the predetermined threshold maybe 0° C. for more than 30 minutes or hey weather forecast indicating low temperatures at or below 0° C. a significant period of time such as several hours.

In some embodiments, the airflow is reversed by changing the rotational direction of the cooling fans 250. The cooling fans 250 maybe configure to rotate in a first direction to generate airflow from the cold aisle to the hot aisle, and in a second direction to generate airflow from the hot aisle to the cold aisle. Some computing devices may have bidirectional vans, while others may be retrofitted with controllable switches connected to the power connector of the fan to enable direction reversal. For example, the controllable switches may be network controllable (e.g., Bluetooth, wifi or ethernet) or they may be connected to ports in the computing device (e.g., USB, RS-232, PCI, etc.) that can be accessed and controlled by controller 298. In other embodiments, the airflow may be reversed by rotating one or more of the computing devices 220 by 180 degrees. The computing devices 220 may for example be mounted on motorized rotatable turntables or platform controllable by controller 298, or they may be manually rotated by data center staff according to tickets generated by the controller 298 that identify which computing devices 220 to rotate and when (e.g., in the event of controller 298 detecting an incoming cold front indicated by a weather forecast).

In some embodiments, the number of computing devices 220 that have their airflow reversed may vary (e.g., in an inverse relationship) with the measured or predicted temperature. For example, if the measured or predicted ambient temperature is 0° C., no computing devices 220 maybe reversed, but if the measured or predicted ambient temperature is minus 20 degrees C., 30% of computing devices 220 may be reversed. In addition to the temperature, maintaining a desired minimum pressure differential between the hot aisle and cold aisle me be desirable. In some embodiments, controller 298 may be configured to adjust the fan speed one or more of the computing devices 220 (e.g., computing devices with reversed airflow, computing devices with normal airflow, or both) in combination with reversing the airflow of some of computing devices 220 in order to maintain that desired minimum pressure differential. In some embodiments, limiting the number of computing devices with reversed airflow (e.g., less than 30%) may help with maintaining that desired minimum pressure differential and to assist with air mixing. For example, The fan speed of computing devices that are not reversed but that are neighboring he reversed computing device may be lowered to allow more hot air to travel back into cold aisle 292.

In some embodiments, the subset of computing devices 220 that have their flow reversed maybe spaced apart from each other to ensure even mixing of hot air with the cold air in the cold aisle. For example, if all the computing devices 220 with reversed airflow we're bunched together in one location in the pod, computing devices far away from that location may not benefit from the mixing of the hot air and the cold air in the cold aisle. This spacing may be horizontal and or vertical relative to the reversed computing devices position on the rack. This is shown by arrows 272 which indicate reversed airflow and are separated from other computing devices with reversed airflow by at least one computing device horizontally and vertically.

Controller 298 may be configured to select which computing device is 220 should be reversed based on a pattern such as every third computing device on a shelf, with subsequent shelves being offset as shown to improve spacing between the computing devices with reversed airflow. In some embodiments, controller 298 may be configured to scatter the computing devices with reversed airflow substantially evenly or randomly across the racks in the pod, and Controller 298 may periodically change which of the computing devices are in a subset to further improved mixing uniformity over time. For example, controller 298 may shift the pattern of reversed air flow computing devices shown in FIG. 2, horizontally every 5 to 10 minutes or whenever hot spots are detected based on temperature readings from the computing devices 220. In other embodiments, controller 298 may use a predetermine time-varying and temperature-varying pattern that has been calibrated for the particular dimensions and configuration of the particular data center and the type of computing devices and workloads operating therein.

In some embodiments, once temperatures are measured that are above the predetermined threshold (e.g., for a predetermined amount of time) or a weather forecast indicative of such temperatures is received, the controller 298 may be configured to undo the reversing of the air flow in the computing devices. In some embodiments, this may be performed dynamically based on the measured temperatures, e.g., by slowly reducing the number of reversed computing devices 220 as the measured temperature increases.

In some situations, such as when there are prolonged low temperatures, for some data center configurations setting a subset of computing devices to operate in reverse airflow mode may not be sufficient to maintain desired operating temperatures and air circulation. In some embodiments, this may be addressed by configuring entire racks of devices to operate in reverse airflow mode as described below.

Figure 3:
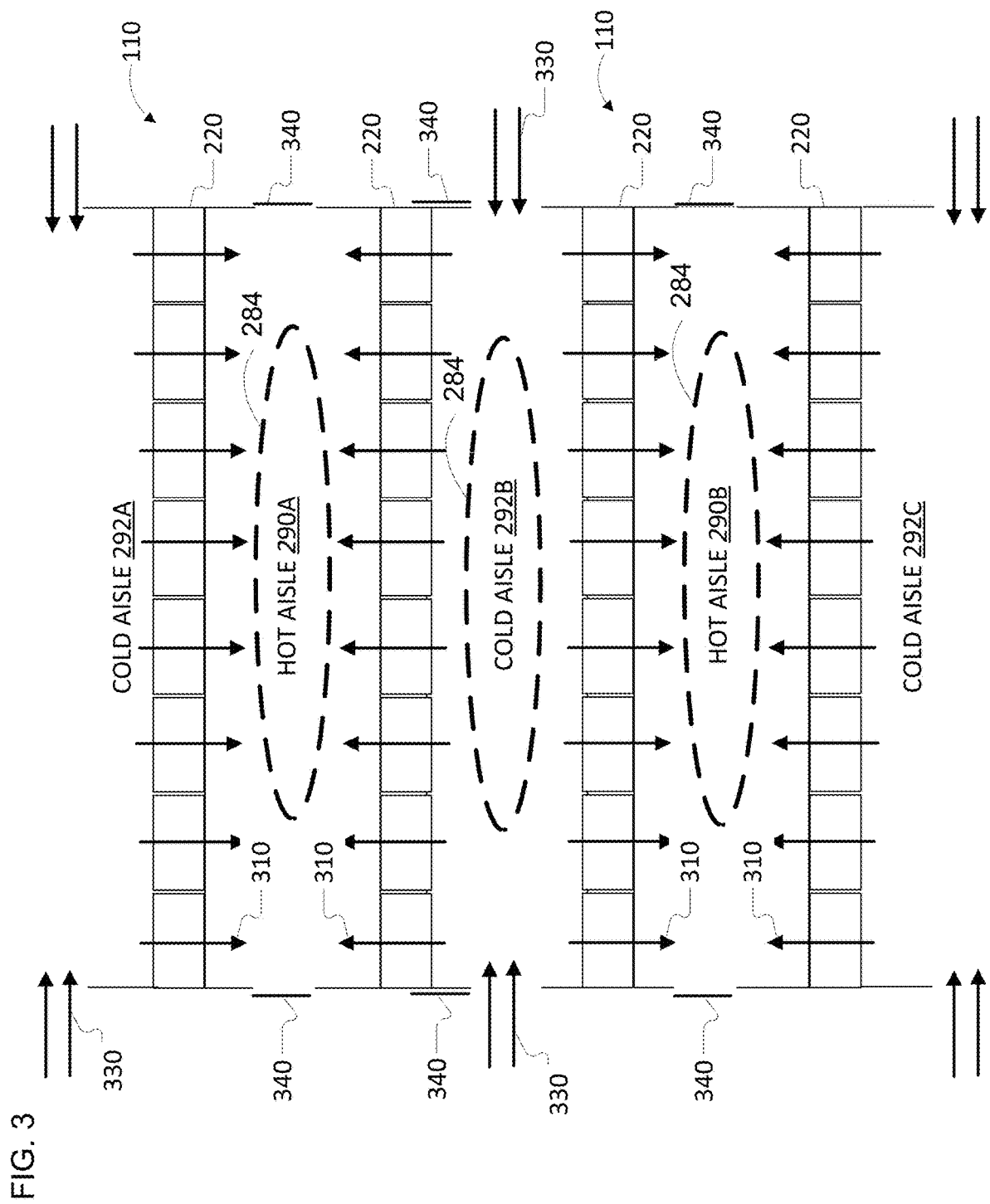
FIG. 3 is a top view of an example embodiment of a portion of a data center housing computing devices configured for normal or high temperatures according to the teachings of the present disclosure.

Turning now to FIG. 3, top view of an example embodiment of a portion of a data center housing computing devices configured in a first mode for normal or high temperatures according to the teachings of the present disclosure is shown. In this configuration, cool ambient air is drawn into cold Isles 292 A 292 B and 292 C as indicated by arrows 330. The cool ambient air is then drawn into computing devices 220 by their cooling fans and then exhausted into hot aisles 290A and 290B as indicated by arrows 310. Hot aisles 290 A and 290 B are sealed except for exhaust openings 284 in the ceiling. Hot aisles 290A and 290B may have adjustable vents or doors 340 that permit access but seal the hot aisles when closed as shown in the figure. Cold aisle 292 B is also configured with these adjustable vents or doors 340, but they are configured to be open to permit the cool ambient air to enter as shown by arrows 330. In some embodiments, cool ambient air may also be drawn into cold aisle 292B through ceiling exhaust vent 284 as the cold aisles may have a lower pressure due to computing devices 220. In other embodiments, the ceiling exhaust vent 284 above cold aisle 292B may be partially or completely closed to control airflow.

Figure 4:
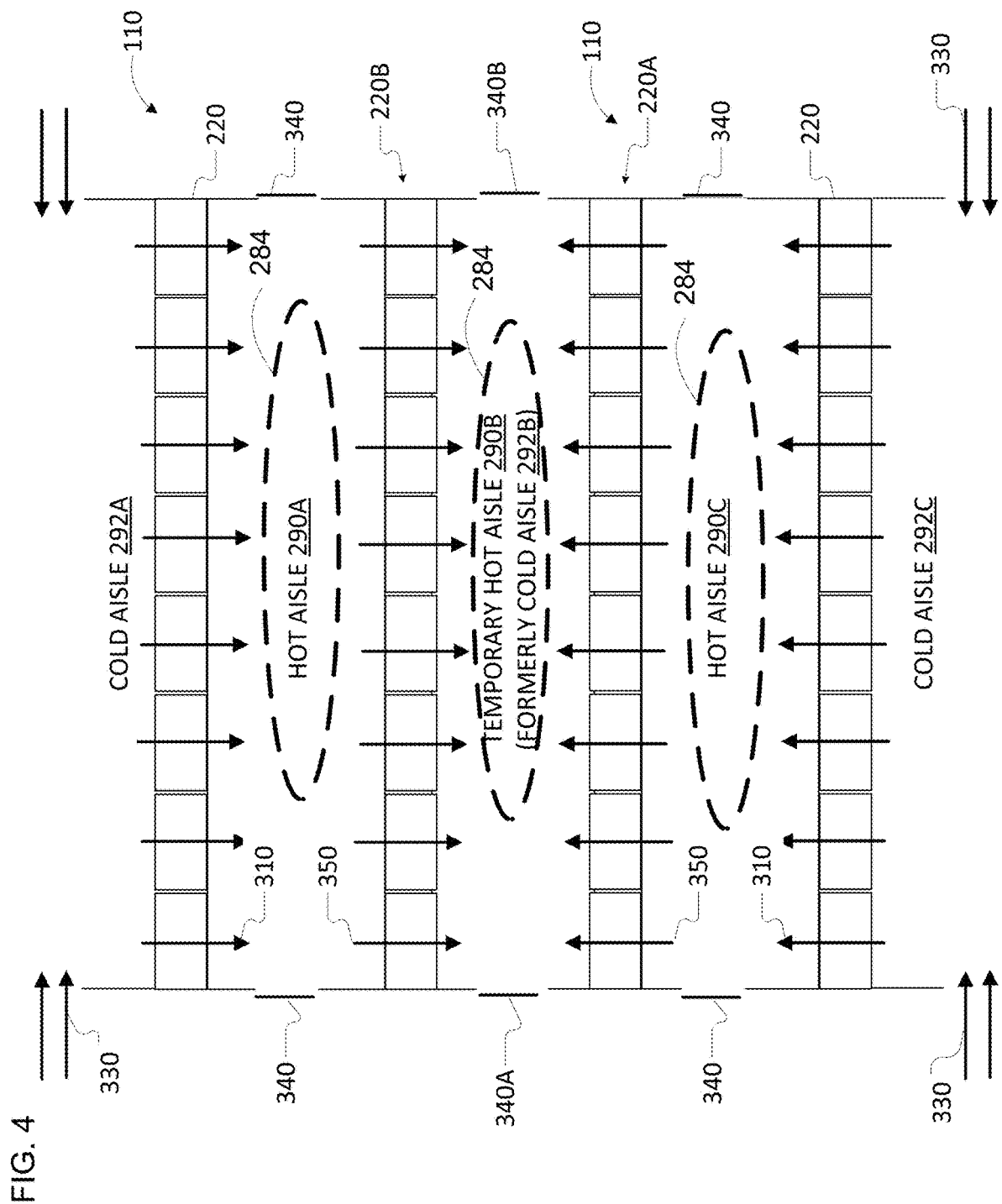
FIG. 4 is a top view of an example embodiment of a portion of a data center housing computing devices configured in a second mode in response to low temperatures according to the teachings of the present disclosure.

Turning now to FIG. 4, a top view of the same example a portion of a data center housing computing devices is shown when configured in a second mode in response to measured temperatures (e.g., from temperature sensors or from weather forecasts) below a predetermined threshold (e.g., for a predetermined time period). In this configuration, cold aisle 292B has been temporarily changed into temporary hot aisle 290B. This may be accomplished by adjusting ventilation openings 340A and 340B into closed position and configuring the row of computing devices 220A and 220B to reverse their airflow direction and pull warm air from hot aisles 290 A and 290 C and exhaust air empty temporary hot aisle 290B as shown by arrows 350. By closing ventilation openings 340A and 340B, the hot air forced into temporarily hot aisle 290B by the row of computing devices 220A and 220B exits out the ceiling exhaust vent 284. If insufficient air is moving through computing devices in rows 220A and 220B, the ceiling exhaust vents 284 above hot aisles 290A and 290C may be partially or completely closed.

In some embodiments, computing devices 220A and 220B may reverse their airflow direction by changing the direction of rotation of their cooling fans such that they rotate in a first direction when the computing devices are in a normal or first mode, and rotate in a second direction when the devices are in a second reversed airflow mode for low temperatures. In some embodiments, controller 298 may be configured to dynamically switch the computing devices modes based on periodically measured cold aisle temperatures.

In this embodiment, the racks are oriented in parallel to form alternating hot dash cold aisles in normal mode and alternating cold-hot-hot aisles when configured in the second low temperature mode. In some embodiments, the fan speed of the computing devices configured for reversed airflow mode may be adjusted based on the measured temperature or the temperature of the computing devices themselves. As previously noted, in some embodiments computing devices 220 may be configured for reverse airflow mode by changing the direction of cooling fan rotation or by physically rotating the device horizontally 180 degrees.

Figure 5:
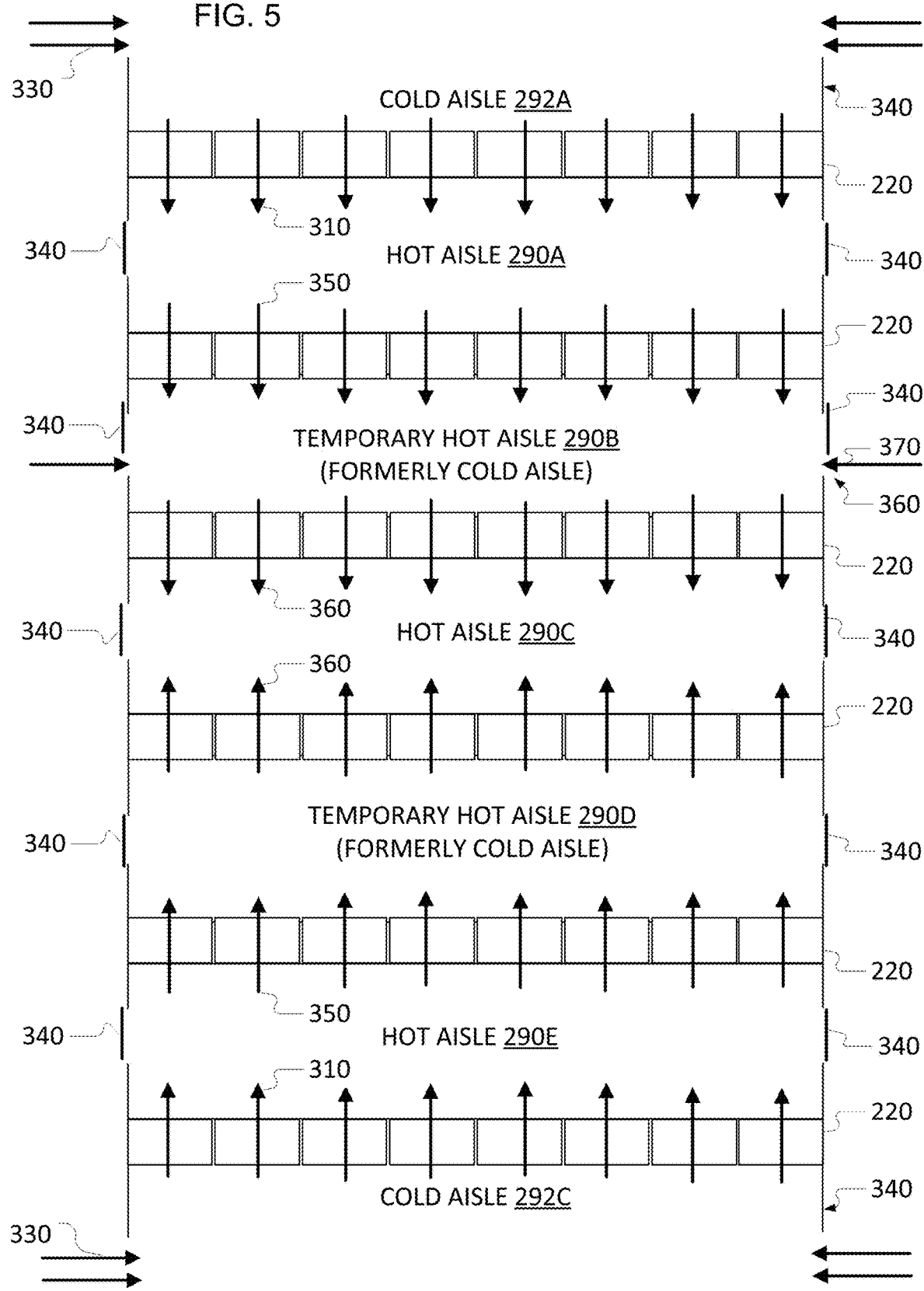
FIG. 5 is a top view of another example embodiment of a portion of a data center housing computing devices configured in a second mode in response to low temperatures according to the teachings of the present disclosure.

Turning now to FIG. 5, a top view of another example embodiment of a portion of a data center housing computing devices configured in an alternate second mode in response to measured temperatures below a predetermined threshold. In this configuration, the data center's low temperature mode results in alternative cold-hot-hot-hot aisles, with hot aisles 290A and 290E feeding warmed air into hot aisles 290B and 290D as shown by arrows 350, which feed warmed air into hot aisle 290C as shown by arrows 360, which exhaust the hot air out a ceiling exhaust vent (not shown).

As shown in this example, in some embodiments some of the adjustable ventilation openings 340 may be adjusted to be partially or completely opened to provide an opening proximate arrow 360 to the hot aisle if the temperature in one or more rows of the computing devices bordering the hot aisle is too high. This will permit cool ambient air to enter the hot aisle (as shown by arrow 370) and mix with the hot air to bring down the temperature of the air entering the next row of computing devices.

Figure 6:
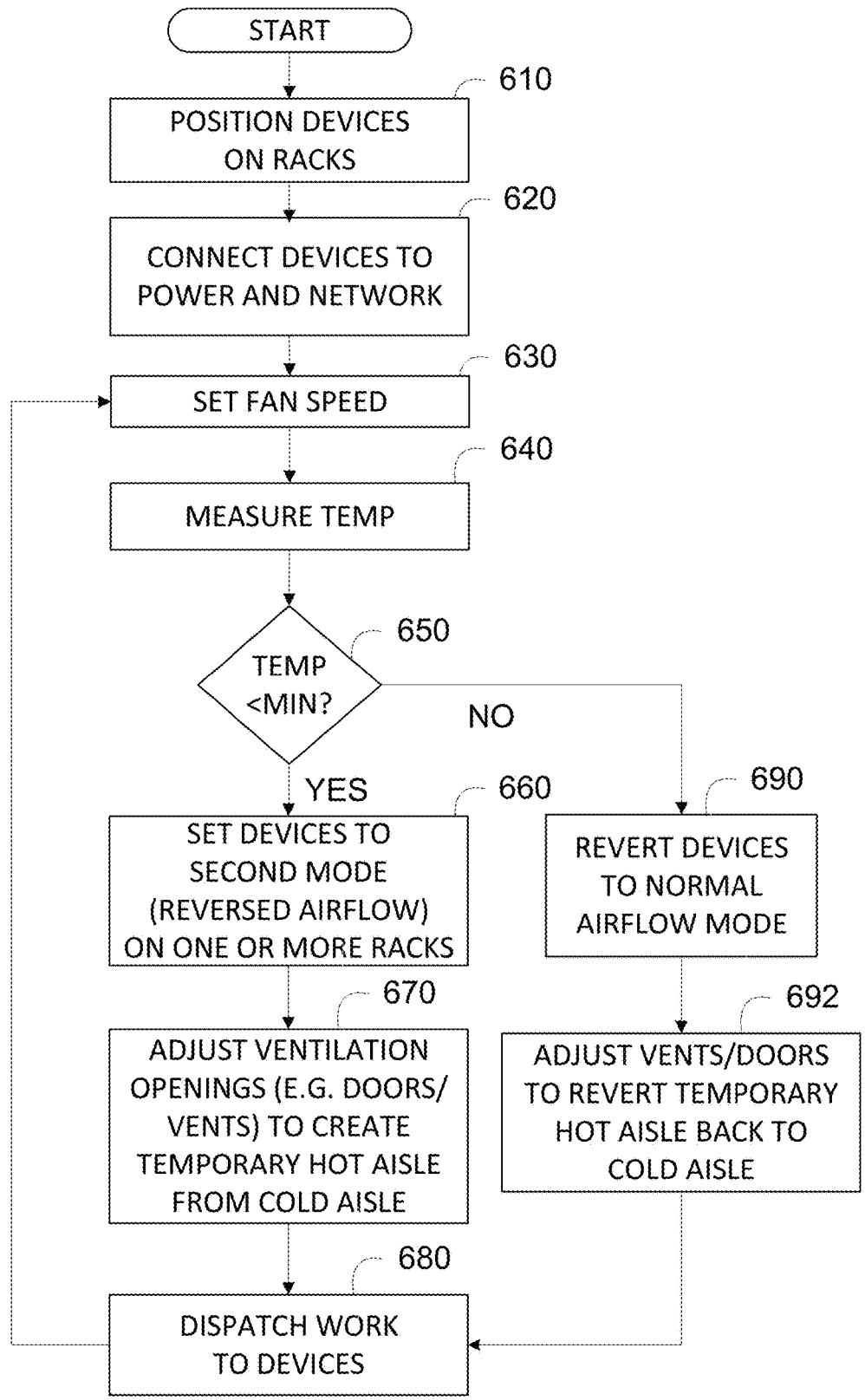
FIG. 6 is a flowchart of an example embodiment of a method for managing airflow for computing devices according to the teachings of the present disclosure.

Turning now to FIG. 6, a flowchart of an example embodiment of a method for managing airflow for computing devices according to the teachings of the present disclosure is shown. In this embodiment, the computing devices are positioned on one or more racks (step 610). The devices are connected to power and network connections (step 620). Cooling fan speeds for the computing devices are set (step 630), e.g., based on a pattern or predetermined default setting or device temperature. Temperature data is measured (step 640), e.g., by reading an environmental sensor or by gathering data from a networked weather forecasting source. If the measured temperature is below a predetermined desired minimum threshold (step 650), computing devices on or more racks may be set to a second (reversed airflow) mode (step 660). One or more ventilation openings may be adjusted (step 670) to create one or more temporary hot aisles from existing cold aisles. Work is dispatched to the computing devices (step 680), and fan speeds are adjusted as needed based on the computing devices temperature (step 630). Many computing devices have internal thermostats that indicate for example the processor or motherboard temperature to ensure safe operation. If the measured temperature is not below the predetermined minimum (step 650), any devices that have been configured in reverse airflow mode maybe unreversed or reset to normal airflow mode (step 690), and the ventilation openings (e.g., doors or vents) may be adjusted to reverted any temporary hot aisles back to cold aisles (step 692).

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A non-transitory, computer-readable storage medium storing instructions executable by a processor of a computational device, which when executed cause the computational device to:
   configure a plurality of computing devices in a first mode to draw in cool air from a plurality of cold aisles and to exhaust heated air into a plurality of hot aisles;
   distribute computing workloads to the plurality of computing devices;
   gathering temperature data; and
   in response to the gathered temperature data being below a predetermined threshold for a predetermined time period, changing one of the plurality of cold aisles into a temporary hot aisle by (i) adjusting one or more ventilation openings, (ii) generating tickets identifying a subset of the plurality of computing devices to be reconfigured into in a second mode to draw in warm air from the temporary hot aisle; and (iii) configuring the subset of the plurality of computing devices in the second mode to draw in warm air from the temporary hot aisle, wherein second mode positions of the subset of the plurality of computing devices in the second mode are rotated by 180 degrees from first mode positions of the subset of the plurality of computing devices in the first mode.

2. The non-transitory, computer-readable storage medium of claim 1, wherein the gathered temperature data is one or more of the following: cold aisle temperatures read from network-enabled temperature sensors, and weather forecast data read from a weather web service.

3. The non-transitory, computer-readable storage medium of claim 1, wherein the instructions, when executed, further cause the computational device to: select and set a data center aisle configuration based on the gathered temperature data, wherein the aisle configuration is selected from the following configurations: alternating cold-hot aisles, alternating cold-hot-hot aisles, and alternating cold-hot-hot-hot aisles.

4. The non-transitory, computer-readable storage medium of claim 1, wherein the instructions, when executed, further cause the computational device to energize one or more motorized rotatable turntables supporting the computing devices configured in the second mode to achieve the 180 degrees rotation.

5. A non-transitory, computer-readable storage medium storing instructions executable by a processor of a computational device, which when executed cause the computational device to:
configure a plurality of computing devices with cooling fans in a first mode to draw in cool air from a plurality of cold aisles and to exhaust heated air into a plurality of hot aisles;
distribute computing workloads to the plurality of computing devices;
gathering temperature data; and
in response to the gathered temperature data being below a predetermined threshold for a predetermined time period, changing one of the plurality of cold aisles into a temporary hot aisle by (i) adjusting one or more ventilation openings, (ii) generating tickets identifying a subset of the plurality of computing devices to be reconfigured into in a second mode to draw in warm air from the temporary hot aisle; and (iii) configuring the subset of the plurality of computing devices in the second mode to draw in warm air from the temporary hot aisle, wherein the cooling fans of the computing devices in the second mode rotate in a different direction than the cooling fans of the computing devices in the first mode.

6. The non-transitory, computer-readable storage medium of claim 5, wherein the gathered temperature data is one or more of the following: cold aisle temperatures read from network-enabled temperature sensors, and weather forecast data read from a weather web service.

7. The non-transitory, computer-readable storage medium of claim 5, wherein the instructions, when executed, further cause the computational device to: select and set a data center aisle configuration based on the gathered temperature data, wherein the aisle configuration is selected from the following configurations: alternating cold-hot aisles, alternating cold-hot-hot aisles, and alternating cold-hot-hot-hot aisles.

8. A non-transitory, computer-readable storage medium storing instructions executable by a processor of a computational device, which when executed cause the computational device to:
configure a plurality of computing devices in a first mode to draw in cool air from a plurality of cold aisles and to exhaust heated air into a plurality of hot aisles;
distribute computing workloads to the plurality of computing devices;
gather temperature data; and
in response to the gathered temperature data being below a predetermined threshold for a predetermined time period, effect a changing of at least one of the plurality of cold aisles into a temporary hot aisle by (i) adjusting one or more ventilation openings, and (ii) generating tickets identifying a subset of the plurality of computing devices to be reconfigured into in a second mode to draw in warm air from the temporary hot aisle.

9. The non-transitory, computer-readable storage medium of claim 8, wherein at least one of the tickets further comprises information on when the reconfiguration should take place.

10. The non-transitory, computer-readable storage medium of claim 8, wherein the gathered temperature data includes one or more of the following: cold aisle temperatures read from network-enabled temperature sensors, and weather forecast data read from a weather web service.

11. The non-transitory, computer-readable storage medium of claim 8, wherein the instructions, when executed, further cause the computational device to: select and set a data center aisle configuration based on the gathered temperature data, wherein the aisle configuration is selected from the following configurations: alternating cold-hot aisles, alternating cold-hot-hot aisles, and alternating cold-hot-hot-hot aisles.

12. The non-transitory, computer-readable storage medium of claim 1, wherein at least one of the tickets further comprises information on when the reconfiguration should take place.

13. The non-transitory, computer-readable storage medium of claim 5, wherein at least one of the tickets further comprises information on when the reconfiguration should take place.

14. The non-transitory, computer-readable storage medium of claim 1, wherein the gathered temperature data includes cold aisle temperatures read from network-enabled temperature sensors and weather forecast data read from a weather web service.

15. The non-transitory, computer-readable storage medium of claim 5, wherein the gathered temperature data includes cold aisle temperatures read from network-enabled temperature sensors and weather forecast data read from a weather web service.

16. The non-transitory, computer-readable storage medium of claim 8, wherein the gathered temperature data includes cold aisle temperatures read from network-enabled temperature sensors and weather forecast data read from a weather web service.

* * * * *